(12) United States Patent
Wendt

(10) Patent No.: US 6,670,668 B2
(45) Date of Patent: Dec. 30, 2003

(54) MICROELECTRONIC STRUCTURE, METHOD FOR FABRICATING IT AND ITS USE IN A MEMORY CELL

(75) Inventor: Hermann Wendt, Grasbrunn (DE)

(73) Assignee: Infineon Technologies AG, Munich (DE)

( * ) Notice: Subject to any disclaimer, the term of this patent is extended or adjusted under 35 U.S.C. 154(b) by 117 days.

(21) Appl. No.: 09/796,208

(22) Filed: Feb. 28, 2001

(65) Prior Publication Data

US 2001/0032992 A1 Oct. 25, 2001

Related U.S. Application Data

(63) Continuation of application No. PCT/DE99/02414, filed on Aug. 2, 1999.

(30) Foreign Application Priority Data

Aug. 31, 1998 (DE) .......................................... 198 39 605

(51) Int. Cl.[7] .................... H01L 27/108; H01L 29/76; H01L 29/94; H01L 31/119; H01L 31/062
(52) U.S. Cl. ........................................ 257/310; 257/295
(58) Field of Search ................................. 257/295, 310

(56) References Cited

U.S. PATENT DOCUMENTS

| | | | |
|---|---|---|---|
| 5,005,102 A | | 4/1991 | Larson |
| 5,464,786 A | | 11/1995 | Figura et al. |
| 5,728,603 A | | 3/1998 | Emesh et al. |
| 5,854,499 A | * | 12/1998 | Nishioka .................... 257/295 |
| 6,078,072 A | * | 6/2000 | Okudaira et al. ........... 257/295 |
| 6,204,525 B1 | * | 3/2001 | Sakurai et al. .............. 257/295 |

FOREIGN PATENT DOCUMENTS

| | | |
|---|---|---|
| CN | 1123465 A | 5/1996 |
| EP | 0 697 714 A1 | 2/1996 |
| EP | 0 697 720 A1 | 2/1996 |
| EP | 0 766 319 A2 | 4/1997 |
| EP | 0 855 738 A2 | 7/1998 |
| JP | 09 246 082 | 9/1997 |

OTHER PUBLICATIONS

R. Glang et al.: "Determination of Stress in Films on Single Crystalline Silicone Substrates", The Review Of Scientific Instruments, vol. 36, No. 1, Jan. 1965, pp. 7–10.
J.O. Olowolafe et al.: "Effects of anneal ambients and Pt thickness on Pt/Ti and Pt/Ti/TiN interfacial reactions", J. Appl. Phys. vol. 73, No. 4, Feb. 15, 1993, pp. 1764–1772.
Tohru Hara et al.: "Barrier Properties for Oxygen diffusion in a TaSiN Layer", Jpn. J. Appl. Phys., vol. 36, 1997, pp. L893–L895.
Lynnette D. Madsen et al.: "Analysis of the Stress and Interfacial Reactions in Pt/Ti/SiO$_2$/Si for Use with Ferroelectric Thin Films", Journal of Electronic Materials, vol. 27, No. 5, May 1998, pp. 418–426, XP–000874355.
Yuichi Matsui et al.: "Thermal Stability of Pt Bottom Electrodes for Ferroelectric Capacitors", Jpn. J. Appl. Phys., vol. 37, Nr. 4B, pp. L465–L467, XP–000874515.

* cited by examiner

Primary Examiner—Wael Fahmy
Assistant Examiner—Howard Weiss
(74) Attorney, Agent, or Firm—Laurence A. Greenberg; Werner H. Stemer; Gregory L. Mayback

(57) ABSTRACT

A microelectronic structure that is suitable, in particular, as part of a storage capacitor includes a semiconductor structure, a barrier structure, an electrode structure, and a dielectric structure made of a high-epsilon material. The electrode structure has a tensile mechanical layer stress. The microelectronic structure is fabricated, in particular, by sputtering platinum in order to form the electrode structure at a sputtering temperature of at least 200° C.

8 Claims, 2 Drawing Sheets

MICROELECTRONIC STRUCTURE, METHOD FOR FABRICATING IT AND ITS USE IN A MEMORY CELL

CROSS-REFERENCE TO RELATED APPLICATION

This application is a continuation of copending International Application No. PCT/DE99/02414, filed Aug. 2, 1999, which designated the United States.

BACKGROUND OF THE INVENTION

FIELD OF THE INVENTION

The invention relates to a microelectronic structure having a semiconductor structure, a barrier structure, an electrode structure and a dielectric structure made of a high-epsilon material. Structures of this type are used, in particular, as part of a capacitor.

With increasing miniaturization of semiconductor circuit configurations, in particular memory cell configurations, high-epsilon materials are used as a dielectric for capacitor structures. Capacitors of this type are used, in particular, as a storage capacitor or as part of a sensor element. High-epsilon material is a term used to denote dielectric materials having a dielectric constant $\epsilon > 10$. In particular, the high-epsilon materials include paraelectric and ferroelectric materials. In particular, barium strontium titanate (BST) and strontium bismuth tantilate (SBT) are being investigated with regard to their use as a storage dielectric in a storage capacitor.

High-epsilon materials are usually deposited by metal organic deposition in MOCVD (metal organic chemical vapor deposition) or MOD (metal organic deposition) processes which are carried out at high temperatures in an oxygen-containing atmosphere. In order to obtain the leakage currents of less than $10^{-8}$ A/cm$^2$ which are desired for memory applications, a subsequent heat treatment in oxygen is furthermore necessary, which is carried out at 550° C. in the case of BST.

It has been proposed (see U.S. Pat. No. 5,005,102), in the context of the fabrication of capacitors in integrated circuits, to use a barrier layer made of titanium/titanium nitride in order to protect semiconductor structures configured underneath the high-epsilon material.

Investigations (see, for example, J. O. Olowolafe et al., J. Appl. Phys. Vol. 73, No. 4, 1993, pages 1764 to 1772) show that when a barrier made of titanium/titanium nitride is used, during the deposition process of the high-epsilon material, the barrier is easily oxidized and TiO$_2$ is formed, which is an insulator and adversely affects the conductivity of the electrode structure. Moreover, titanium nitride separates at high temperatures, which can lead to the destruction of the storage capacitors.

Therefore, it has been proposed (see T. Hara et al., Jpn. J. Appl. Phys. Vol. 36 (1997), pages L893 to L895) to use as the barrier a material including three components, for example TaSiN. However, additional equipment with expensive targets is required for depositing these materials.

SUMMARY OF THE INVENTION

It is accordingly an object of the invention to provide a microelectronic structure that can form part of a storage capacitor and a method for producing the microelectronic structure which overcomes the above-mentioned disadvantageous of the prior art apparatus and methods of this general type. In particular, it is an object of the invention to provide a microelectronic structure having a semiconductor structure, a barrier structure, an electrode structure and a dielectric structure made of a high-epsilon material that can be used in producing a storage capacitor and can be fabricated without costly equipment.

With the foregoing and other objects in view there is provided, in accordance with the invention a microelectronic structure for a capacitor, which includes: a semiconductor structure; a barrier structure including a titanium layer and a titanium nitride layer; an electrode structure having a tensile mechanical layer stress; and a dielectric structure made of a high-epsilon material. The electrode structure is disposed on the barrier structure, and the dielectric structure is disposed on the electrode structure. The barrier structure, the electrode structure, and the dielectric structure form a layer stack disposed on the semiconductor structure.

The microelectronic structure has an electrode structure having a tensile mechanical layer stress. Experts also commonly use the term stress for the mechanical layer stress. The invention makes use of the insight that high-epsilon materials deposited at high temperatures have a tensile layer stress. Furthermore, the invention makes use of the insight that the layer stress of the electrode structure determines the total layer stress of electrode structure and barrier structure. By virtue of the fact that, in the structure according to the invention, the electrode structure has a tensile layer stress, that is to say the layer stress is greater than 0 Pa, and the structure curves away from the substrate at the edge of the structure, the dielectric structure and the substrate on which it is produced have a similar layer stress. This prevents a change in the layer stress as a result of the application of the dielectric structure. Such a change in the layer stress is held responsible for the separation of the electrode structure from the barrier structure in the known method and the oxidation of the barrier structure in the known method.

The dielectric structure can be formed from any desired high-epsilon material. In particular, the dielectric structure has barium strontium titanate (BST), strontium bismuth tantalate (SBT), lead zirconium titanate (PZT) or the like.

In accordance with an added feature of the invention, the electrode structure contains platinum, which is often used as an electrode material in connection with high-epsilon materials because of its reaction behavior.

In accordance with an additional feature of the invention, the electrode structure made of platinum preferably has a resistivity in the range between 10.5 and 13 $\mu\Omega$cm. It has been shown that platinum with a resistivity in this range additionally has a diffusion barrier effect for oxygen. This effect is presumably attributable to the higher density of the platinum. As a result of this diffusion barrier effect, the underlying barrier structure is additionally protected against oxidation during the deposition of the dielectric layer.

In accordance with another feature of the invention, the platinum in the electrode structure preferably has an average grain size of between 60 and 100 nm. With an average grain size in this range, platinum has a distinct [111] texture, which has proved to be advantageous for the quality of the dielectric structure deposited thereon.

In accordance with a further feature of the invention, the barrier structure is provided in such a way that it contains a titanium layer and a titanium nitride layer, since these materials are customary and have been well investigated as barrier materials in semiconductor technology. The titanium nitride layer preferably has a resistivity in the range between 70 and 200 μΩcm. This reduces the sheet resistance of barrier structure and electrode structure.

In accordance with a further added feature of the invention, it is particularly advantageous to provide the titanium nitride layer having a stoichiometry N:Ti>1, since the oxidizability of the barrier structure is thereby reduced.

In accordance with a further additional feature of the invention, the barrier structure preferably has a layer stress >−200 MPa resulting in that the combination of barrier structure and electrode structure has a tensile layer stress. It is particularly advantageous if the layer stress of the barrier structure is >200 MPa, since the barrier structure then also has a tensile layer stress.

In accordance with yet an added feature of the invention, the semiconductor structure preferably contains silicon and the barrier structure contains titanium nitride and titanium. The titanium layer has a thickness of between 10 and 40 nm and the titanium nitride layer has a thickness of between 80 and 200 nm. The electrode structure contains platinum and has a thickness of between 50 and 200 nm. The dielectric structure has BST and a thickness of between 8 and 50 nm.

As an alternative, the dielectric structure contains a different high-epsilon material, in particular lead zirconium titanate or strontium bismuth tantalate. In this case, the materials of the barrier structure and of the electrode structure are adapted to the material of the respective dielectric structure.

With the foregoing and other objects in view there is provided, in accordance with the invention a method of fabricating the microelectronic structure. It is advantageous to produce, on a support, a layer stack having the semiconductor structure, the barrier structure, the electrode structure and the dielectric structure. The electrode structure is formed by sputtering platinum at a sputtering temperature of at least 200° C. It has been shown that the mechanical layer stress of the electrode structure is essentially a function of the deposition temperature. The mechanical layer stress, for which the term stress is also often used in the technical literature, is tensile when platinum is deposited by sputtering at a sputtering temperature of at least 200° C.

In accordance with an added mode of the invention, the sputtering temperature for the deposition of the electrode structure made of platinum is preferably chosen between 450 and 550° C. It has been shown that, at this higher deposition temperature, a lower sheet resistance of the platinum, a larger average grain size of the platinum and a pronounced [111] layer texture are additionally obtained. Furthermore, it has been observed that platinum sputtered at relatively high temperature constitutes a better diffusion barrier for oxygen and thereby protects the underlying barrier structure more effectively against oxidation during the deposition of the dielectric structure.

It has been shown that the chosen power and the pressure during sputtering have only a minor influence on the properties of the platinum of the electrode structure. The sputtering power is set in the range between 0.5 and 2 kW and the sputtering pressure in the range between 1 and 5 mTorr.

In accordance with an additional mode of the invention, the barrier layer is preferably formed from a titanium layer and a titanium nitride layer. The titanium nitride layer is formed by sputtering in an atmosphere having a nitrogen proportion of at least 70 percent. The nitrogen proportion is determined as a ratio of the gas flows in standard cubic centimeters (sccm). A gas mixture including argon and nitrogen is preferably used for the sputtering of the titanium nitride. The pressure is preferably between 5 and 15 mTorr. It has been shown that the oxidizability of the barrier structure is reduced by the high nitrogen proportion in the sputtering atmosphere.

In accordance with an another mode of the invention, the titanium nitride layer is preferably deposited at temperatures of between 400 and 500° C. and with a nitrogen proportion of 80 percent in the sputtering atmosphere. As a result, the oxidizability of the barrier structure is reduced further. Furthermore, the mechanical layer stresses in the barrier structure become zero or slightly tensile.

In accordance with a further mode of the invention, the microelectronic structure can advantageously be used as part of a storage capacitor in a memory cell, with the electrode structure constituting a first electrode of the storage capacitor. The storage capacitor furthermore has a second electrode configured on the side of the dielectric structure which is opposite to the first electrode.

In accordance with a concomitant mode of the invention, as an alternative, the microelectronic structure can be used as part of a sensor or actuator.

Other features which are considered as characteristic for the invention are set forth in the appended claims.

Although the invention is illustrated and described herein as embodied in a microelectronic structure, method for fabricating it and its use in a memory cell, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

DESCRIPTION OF THE PREFERRED EMBODIMENTS

Figure 1:
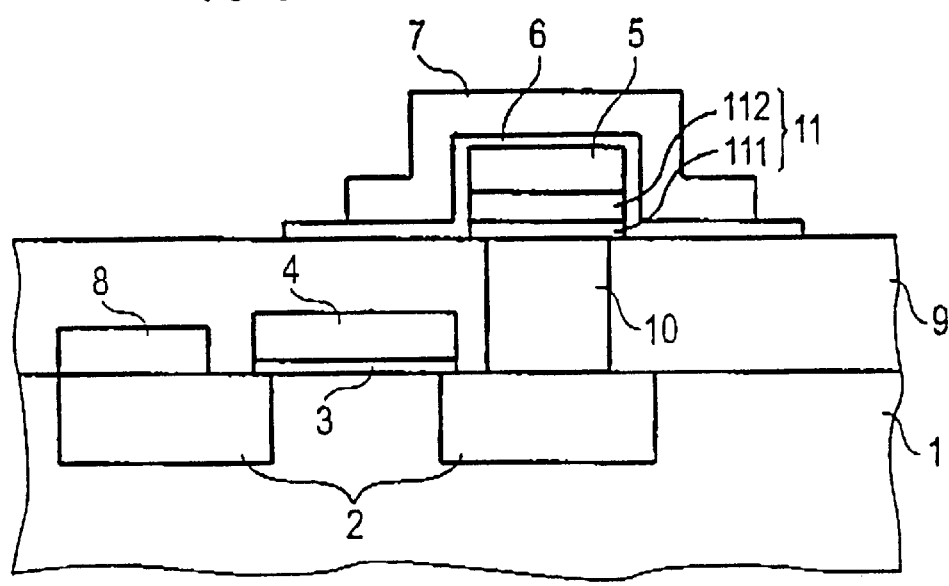
FIG. 1 shows a section through a memory cell having a storage capacitor that includes a microelectronic structure with a semiconductor structure, a barrier structure, an electrode structure, and a dielectric structure.

Referring now to the figures of the drawing in detail and first, particularly, to FIG. 1 thereof, there is shown a semiconductor substrate 1 that contains a memory cell configuration having a multiplicity of memory cells. Each of the memory cells has a selection transistor having two source/drain regions 2, a gate oxide region 3, a gate electrode 4 and a storage capacitor having an electrode structure 5, a dielectric structure 6 and a top electrode structure 7 (see FIG. 1). The gate electrode 4 is connected to a word line, and one of the source/drain regions 2 is connected to a bit line 8. An intermediate oxide layer 9 covers the selection transistor. Provided in the intermediate oxide layer 9 is a contact hole which reaches to the other source/drain region 2, specifically the one not connected to the bit line 8. The contact hole is filled with a semiconductor structure 10. The semiconductor structure 10 contains doped polysilicon. Configured on the surface of the semiconductor structure 10 is a barrier structure 11, which completely covers the surface of the semiconductor structure 10. The barrier structure 11 includes a titanium layer 111 and a titanium nitride layer 112 configured above the latter. The titanium layer 111 has a thickness of 20 nm. The titanium nitride layer 112 has a thickness of 100 nm.

The barrier structure 11 is electrically conductive. The semiconductor structure 10 which is made of n$^+$-doped polysilicon with a dopant concentration of $5 \times 10^{19}$ to $5 \times 10^{20}/$cm$^3$ together with the barrier structure 11, constitute an electrical connection between the source/drain region 2 and the bottom electrode structure 5 of the storage capacitor.

The bottom electrode structure 5 of the storage capacitor has a thickness of 100 nm. It contains platinum.

The dielectric structure 6 contains BST and has a thickness of 50 nm.

The top electrode structure 7 contains platinum and has a thickness of 100 nm.

In order to fabricate the barrier structure 11 and the bottom electrode structure 5, firstly a titanium layer 111 having a thickness of 20 nm is deposited in Ar at a pressure of 1 to 5 mTorr and with a sputtering power of between 1 and 5 kW. Afterward, the titanium nitride layer 112 having a thickness of 100 nm is deposited in a reactive sputtering process in a gas mixture including argon and nitrogen at a pressure of between 5 and 15 mTorr and with a sputtering power of 6.5 kW and a nitrogen proportion of 80 percent in the sputtering atmosphere. The temperature during the deposition is 400 to 500° C. Under these deposition conditions, the mechanical layer stress of the barrier structure 11 is zero up to slightly tensile. It is greater than −200 MPa. Furthermore, these deposition conditions mean that the nitrogen proportion is in the titanium nitride layer 112 with a stoichiometry N:Ti>1. The barrier structure 11 has a sheet resistivity of 90 $\mu\Omega$cm.

The bottom electrode structure 5 made of platinum is subsequently deposited in a sputtering process at a deposition temperature of 450 and 550° C., a pressure of 3.5 mTorr and with a sputtering power of 0.5 kW. With these deposition parameters, the bottom electrode structure 5 has a tensile layer stress. Furthermore, the bottom electrode structure 5 has a resistivity of 11 $\mu\Omega$cm. It has a distinct [111] texture.

Moreover, as a result of the deposition conditions, the bottom electrode structure 5 exhibits a good diffusion barrier effect for oxygen.

Figure 2:
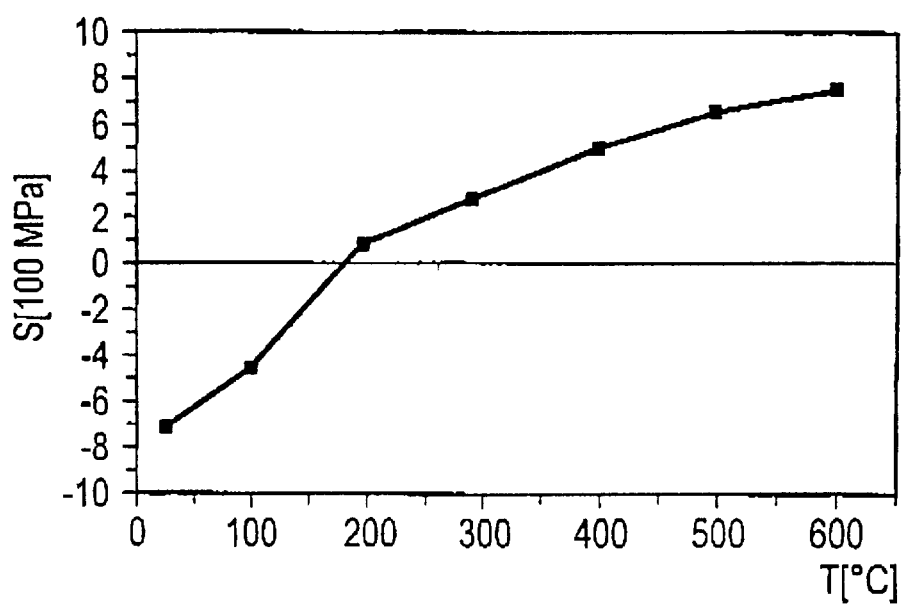
FIG. 2 shows the relationship between sputtering temperature and mechanical layer stress of a platinum layer.

FIG. 2 illustrates the dependence of the mechanical layer stress S, also called stress of a platinum layer as a function of the temperature T in degrees Celsius (° C.). The platinum layer has a thickness of 100 nm and was deposited with a sputtering power of 0.5 kW, a gas flow of 65 sccm argon and a sputtering pressure of 3.5 mTorr. FIG. 2 shows that above a deposition temperature of 200° C., the mechanical layer stress S becomes >0. In other words, the layer has a tensile layer stress. The layer stress S is determined as follows: capacitively or by a laser, the form or position of the wafer between the capacitor plates is determined at various locations on the wafer. By comparison with a plane wafer, the wafer bending can be determined and the stress can thus be calculated according to R. Glang (Rev. of Sci. Instr., 36 (1965) page 7).

Figure 3:
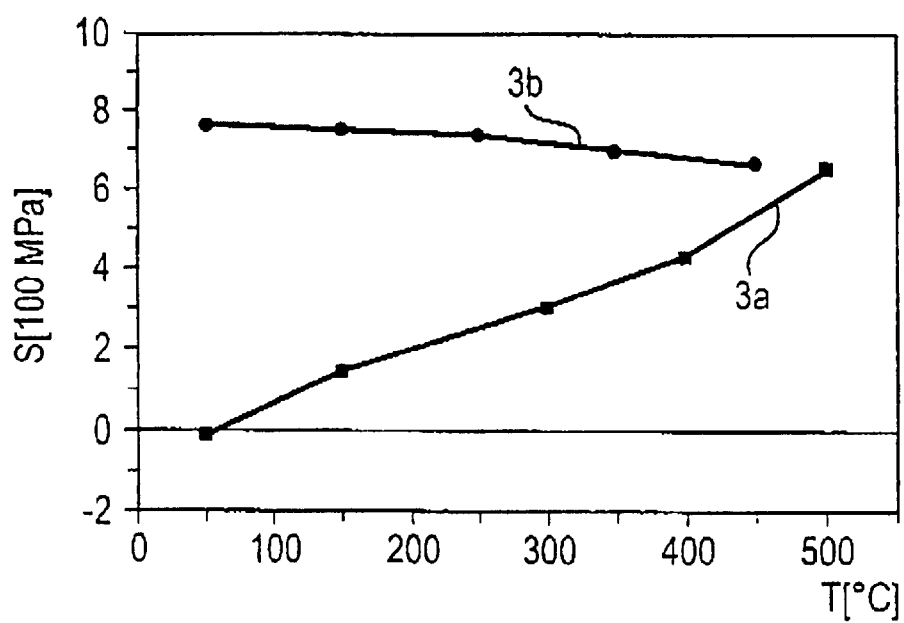
FIG. 3 shows the relationship between mechanical layer stress and sputtering temperature of a Pt/TiN/Ti stack.

FIG. 3 illustrates the relationship between the mechanical layer stress S and the sputtering temperature T for a stack which has a titanium layer having a thickness of 20 nm, a titanium nitride layer having a thickness of 100 nm configured on the titanium layer, and a platinum layer having a thickness of 100 nm configured on the titanium nitride layer. The curve 3a shows the relationship for the case where the titanium layer and titanium nitride layer are deposited at a deposition temperature of 450° C., while the deposition temperature of the platinum layer varies. The curve 3b shows the relationship for the case where the platinum layer is deposited at 500° C. and the deposition temperature of the titanium nitride layer and of the titanium layer varies.

The curve 3a reveals that the mechanical layer stress of the stack becomes increasingly tensile as the deposition temperature of the platinum increases. The curve 3b reveals that the layer stress S of the stack is scarcely influenced by the increasing deposition temperature of the titanium nitride layer and of the titanium layer. A comparison of curves 3a and 3b shows that the layer stress of the stack is essentially influenced by the deposition temperature of the platinum.

As can be gathered from FIG. 2, the mechanical layer stress S of the platinum layer is a function of the deposition temperature of the platinum layer. In other words, the resulting layer stress of the stack (see FIG. 3) is essentially determined by the layer stress of the platinum layer.

I claim:

1. A memory cell structure, which comprises:
    a transistor having:
        an electrode; and
        a capacitor having a first electrode structure of platinum, said platinum of said first electrode structure having a texture and being an average grain size of between 60 nm and 100 nm, a second electrode structure, a dielectric structure of a high epsilon material, and a barrier structure;
    an isolation layer covering said transistor;
    said isolation layer defining a contact hole extending therethrough, said contact hole being filled with doped silicon, said doped silicon filled in said contact hole being in contact with said electrode of said transistor;
    said barrier structure having a first layer of titanium and a second layer of titanium nitride;
    said first layer being disposed on said doped silicon;
    said second layer being disposed on said first layer and having a stoichiometry N:Ti>1;

said first electrode structure of platinum being disposed on said second layer of titanium nitride;

said dielectric structure being disposed on said first electrode structure; and said second electrode structure being disposed on said dielectric structure.

2. The memory cell structure according to claim 1, wherein said barrier structure has a mechanical layer stress>−200 MPa.

3. The memory cell structure according to claim 1, wherein:

said first layer of said barrier structure has a thickness of between 10 nm and 40 nm;

said second layer of said barrier structure has a thickness of between 80 nm and 200 nm;

said first electrode structure includes platinum and has a thickness of between 50 nm and 200 nm; and said dielectric structure includes barium strontium titanate.

4. The memory cell structure according to claim 1, wherein said first electrode structure has a resistivity of between 10.5 $\mu\Omega$cm and 13 $\mu\Omega$cm.

5. The memory cell structure according to claim 1, wherein said second layer of said barrier structure has a resistivity of between 70 $\mu\Omega$cm and 200 $\mu\Omega$cm.

6. The memory cell structure according to claim 1, wherein said first layer has a common boundary surface with said doped silicon filling said contact hole, said second layer has a common boundary surface with said first layer, and said first electrode structure has a common boundary surface with said second layer.

7. A memory cell structure, which comprises:

a transistor having:
an electrode; and
a capacitor having a first electrode structure of platinum, said platinum of first electrode structure having a texture and being of an average grain size of between 60 nm and 100 nm, a second electrode structure, a dielectric structure of a high epsilon material, and a barrier structure;

an isolation layer covering said transistor;

said isolation layer defining a contact hole extending therethrough, said contact hole being filled with doped silicon, said doped silicon filled in said contact hole being in contact with said electrode of said transistor;

said barrier structure having a first layer consisting of titanium and a second layer consisting of titanium nitride;

said first layer being disposed on said doped silicon;

said second layer being disposed on said first layer and having a stoichiometry N:Ti>1;

said first electrode structure being disposed on said second layer;

said dielectric structure being disposed on said first electrode structure; and said second electrode structure being disposed on said dielectric structure.

8. A memory cell structure, which comprises:

a transistor having:
an electrode; and
a capacitor having a first electrode structure of platinum, said platinum of said first electrode structure having a texture and being of an average grain size of between 60 nm and 100 nm, a second electrode structure, a dielectric structure of a high epsilon material, and a barrier structure;

an isolation layer covering said transistor;

said isolation layer defining a contact hole extending therethrough, said contact hole being filled with doped silicon, said doped silicon filled in said contact hole being in contact with said electrode of said transistor;

said barrier structure having:
a first layer of titanium and not having titanium nitride; and
a second layer of titanium nitride;

said first layer being disposed on said doped silicon;

said second layer being disposed on said first layer and having a stoichiometry N:Ti>1;

said first electrode structure being disposed on said second layer;

said dielectric structure being disposed on said first electrode structure; and said second electrode structure being disposed on said dielectric structure.

* * * * *